United States Patent [19]

Hecken

[11] 4,157,508
[45] Jun. 5, 1979

[54] SIGNAL CUBER CIRCUIT

[75] Inventor: Rudolf P. Hecken, Andover, Mass.

[73] Assignee: Bell Telephone Laboratories, Incorporated, Murray Hill, N.J.

[21] Appl. No.: 853,333

[22] Filed: Nov. 21, 1977

[51] Int. Cl.² .............................................. H03H 7/04
[52] U.S. Cl. .................................... 328/142; 328/163; 330/149
[58] Field of Search ............... 328/144, 163, 162, 142, 328/145; 330/149

[56] References Cited

U.S. PATENT DOCUMENTS

| | | | |
|---|---|---|---|
| 3,383,618 | 5/1968 | Engelbrecht | 328/163 X |
| 3,428,906 | 2/1969 | Pozzetti | 328/144 X |
| 3,644,836 | 2/1972 | Johnson | 328/143 |
| 3,825,843 | 7/1974 | Felsberg et al. | 328/163 |
| 4,071,781 | 1/1978 | Kayalioglu | 328/163 X |

Primary Examiner—John S. Heyman
Attorney, Agent, or Firm—Sylvan Sherman

[57] ABSTRACT

The problems associated with large bandwidth requirements and of precisely controlling the relative magnitudes of the distortion components generated in predistorters are resolved in a bridge-type cuber circuit (10). The cuber comprises a resistive bridge ($R_1$, $R_2$, $R_3$, $R_4$) which includes a pair of oppositely-poled diodes (D1, D2 and D3, D4) connected in parallel with the resistor ($R_1$, $R_3$) in each branch (25, 26) of one pair of opposite branches of said bridge. The parameters of the cuber, which is balanced with respect to fundamental frequency signals, are adjusted so that predominantly third order intermodulation components are generated, and an impedance match with the signal source is obtained.

The cuber circuit is used in a predistorter for cancelling third order distortion components produced in nominally linear amplifiers.

4 Claims, 4 Drawing Figures

SIGNAL CUBER CIRCUIT

TECHNICAL FIELD

This invention relates to distortion compensating circuits and, in particular, to a third order distortion generator for use in such circuits.

BACKGROUND ART

Predistortion and postdistortion techniques, for cancelling the distortion introduced by the nonlinear transfer characteristic of electromagnetic devices, are well known in the art. Two examples of such circuits are given in U.S. Pat. Nos. 3,732,502 and 3,825,843. In each of the circuits disclosed in these patents, some means are provided for deliberately generating higher order signal components which are used to cancel the distortion signal components inadvertently produced in an amplifier or other nominally linear electromagnetic device.

Advantageously, the distortion generator generates only selected higher order signal components, and does so over some prescribed frequency band of interest. In addition, the distortion generator should operate stably with time and temperature and be of simple design and easy to adjust.

In U.S. Pat. No. 3,732,502 the distortion generator comprises two RC coupled transistors which generate a multiplicity of higher order components. Means are provided for cancelling the first order signal component. However, there are no means for controlling the relative amplitudes of the higher order components or of eliminating any of them.

In U.S. Pat. No. 3,825,843, on the other hand, a more complicated circuit, including a squarer and a multiplier, is used to generate only the third order component. The problem with this circuit, however, is that it was found to be limited in available distortion power and relatively difficult to adjust over the wide frequency band of particular interest to applicant.

SUMMARY OF THE INVENTION

The solution to these problems is provided, in accordance with the present invention, by means of a cuber circuit comprising a resistive bridge characterized in that a pair of oppositely-poled diodes is connected in parallel with the resistor in each branch of one pair of opposite branches of said bridge. Because the combined I-V characteristic of parallel-connected, oppositely-poled substantially identical diodes yields only odd order terms, only odd order voltages are produced at the output terminals of the cuber circuit. By the proper selection of parameters, the fifth order term can be substantially reduced so that the only significant output component is the desired third order term.

It is one of the advantages of a cuber circuit in accordance with the present invention that it can readily be adjusted to generate predominantly third order signal distortions over a wide range of input signal powers, and that the third order signal component so generated is substantially constant over a broad range of input signal powers and frequencies.

IN THE DRAWINGS

DETAILED DESCRIPTION

Figure 1:
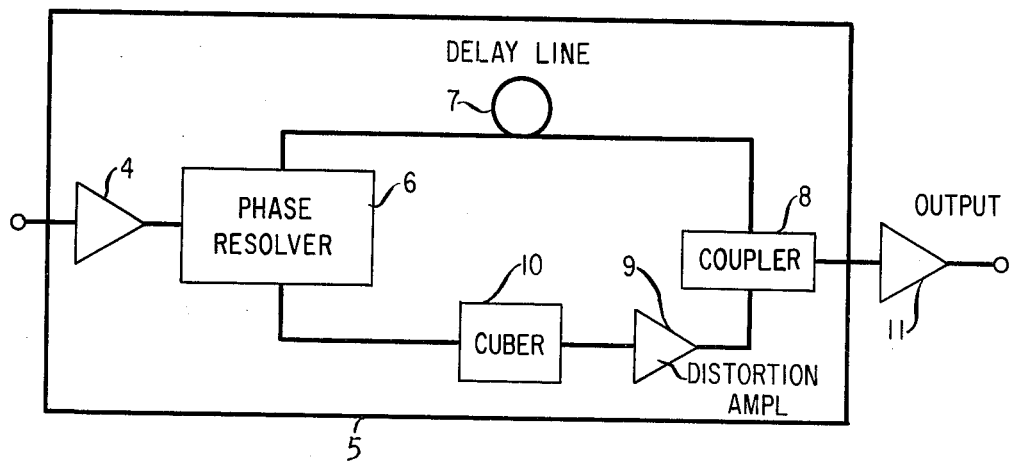
FIG. 1 shows, in block diagram, a distortion compensating circuit using a predistorter to generate distortion cancelling signal components.

Referring to the drawings, FIG. 1 shows the use of a predistorter 5 for cancelling intermodulation distortion components produced in a nominally linear amplifier 11. More specifically, the function of the predistorter is to generate compensation higher order distortion components for neutralizing the higher order distortion components generated by amplifier 11. Typically, a predistorter includes a driver amplifier 4 to obtain the proper signal power, and a phase resolver 6 for dividing an input signal into two components and for establishing a specified phase relation between them. One of the components is coupled to a distortion generator which, in the instant case, is a cuber 10, to be described in greater detail hereinbelow. The output from cuber 10 is optionally amplified in a distortion amplifier 9 to establish the proper distortion level, and is then combined with the other input signal component by means of a coupler 8. To equalize the delays in the two branches of the predistorter, a delay line 7 is included in the other signal component wavepath between resolver 6 and coupler 8.

The output from coupler 8, which includes the desired signal to be amplified and selected distortion components, is then coupled to the input terminal of amplifier 11 wherein both are amplified. Because of the nonlinear input-output characteristic of amplifier 11, higher order signal components are produced therein. However, by proper adjustment of the phase and amplitude of the distortion components produced in predistorter 5, all significant higher order components can be made to add destructively at the output of amplifier 11, resulting in substantially distortion free amplification through amplifier 11.

The present invention relates particularly to the cuber 10 in predistorter 5. Since the dominant distortion component of interest is the third order component, the predistorter must be capable of generating predominantly third order distortion signal components over the frequency band of interest. This is accomplished, in accordance with the present invention, in a cuber circuit 10, illustrated in FIG. 2 comprising a resistive bridge including resistors $R_1$, $R_2$, $R_3$ and $R_4$ located, respectively, in bridge branches 25, 26, 27 and 28, and oppositely-poled diode pairs D1, D2 and D3, D4. Each pair of diodes is connected in parallel with the resistor in each of one pair of opposite branches of the bridge circuit. More specifically, the first pair of oppositely-poled diodes D1 and D2 is connected across resistor $R_1$ while the second pair of oppositely-poled diodes D3 and D4 is connected across resistor $R_2$.

A balanced input signal, derived from signal generator 4, is applied across opposite bridge nodes 21 and 22 through matching resistors $R_{11}$ and $R_{22}$. An unbalanced output signal is delivered to a load $R_L$ connected to a second pair of opposite bridge nodes 24 and 23.

The parallel connection of two oppositely-poled diodes with substantially identical I-V characteristics can be represented by a polynomial containing odd order terms. For example, unbiased individual p-n junction diodes, whose I-V relationships are given by $$I = a(e^{bv} - 1), \tag{1}$$

where a and b are constants, yield a combined I-V relationship given by $$I = 2a \sinh(bV) \quad (2)$$

when connected together as shown. Equation (2) is, of course, an odd order polynomial in V. Another example is a pair of so-called "back diodes" (i.e., tunnel diodes operated with reverse bias connected in this manner). Such a diode configuration has an I-V characteristic given by the more general Taylor series $$I = \sum_{\lambda=0}^{\infty} a_{2\lambda+1} V^{2\lambda+1}, \quad (3)$$

where the coefficients $a_n$ are either known or can be determined experimentally.

In any case, so long as the relationship given by (2) or (3) applies, the diode pair, embedded in an otherwise linear network, will only generate odd order intermodulation products of the applied voltages.

Figure 2:
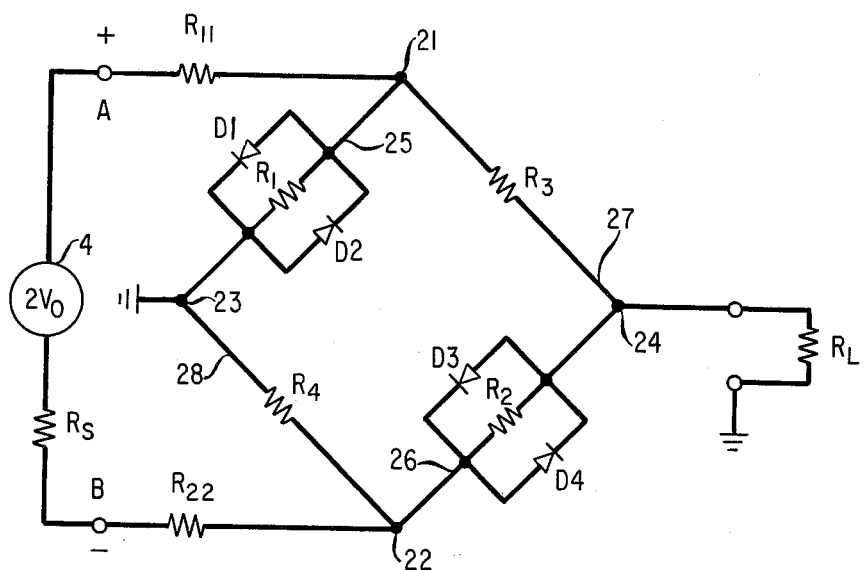
FIG. 2 shows a simplified signal cuber in accordance with the present invention.
Figure 3:
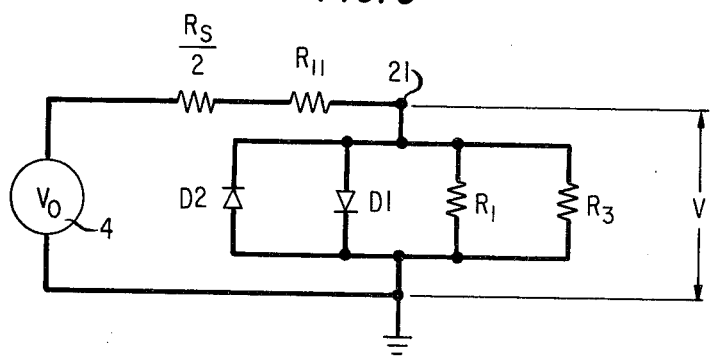
FIG. 3 shows a simplified equivalent half circuit of the cuber of FIG. 2.

When the circuit of FIG. 2 is analyzed for the case where $R_L \to 0$, the upper and lower halves of the bridge circuit are effectively decoupled from each other with respect to the nonlinear current components, and the equivalent circuit of each bridge half is as given in FIG. 3. With respect to node 21, the voltage V and current I through the pair of diodes are related to the input voltage $V_0$ by $$V(G_1 + G_2) + I = V_0 G_1, \text{ where} \quad (4)$$

$$G_1 = (R_s/2 + R_{11})^{-1}, \text{ and} \quad (5)$$

$$G_2 = (R_1 + R_3)/(R_1 R_3). \quad (6)$$

Assuming, for purposes of illustration, the current relationship of equation (3), the implicit relationship between the "output" voltage V and the input voltage $V_0$ becomes $$V(G_1 + G_2) + \sum_{\lambda=0}^{\infty} a_{2\lambda+1} V^{2\lambda+1} = V_0 G_1. \quad (7)$$

Equation (7) can, in turn, be converted into a series in $V_0$, containing only odd order terms as given by $$V = \sum_{\lambda=0}^{\infty} c_{2\lambda+1} V_0^{2\lambda+1} \quad (8)$$

where the coefficients $c_n$ are a function of $a_n$, $G_1$ and $G_2$. In particular, the first three terms are:

$\lambda = 0$ $$c_1 = \frac{G_1}{a_1 + G_1 + G_2} \quad (9)$$

$\lambda = 1$ $$c_3 = \frac{-a_3}{a_1 + G_1 + G_2} \left( \frac{G_1}{a_1 + G_1 + G_2} \right)^3 \quad (10)$$

$\lambda = 2$ $$c_5 = \left[ 3 \left( \frac{a_3}{a_1 + G_1 + G_2} \right)^2 - \right. \quad (11)$$

-continued $$\left. \frac{a_5}{a_1 + G_1 + G_2} \right] \left( \frac{G_1}{a_1 + G_1 + G_2} \right)^5$$

Advantageously, the fifth order component is eliminated by making $$a_1 + G_1 + G_2 = 3a_3^2/a_5 \quad (12)$$

When equation (12) is satisfied the only significant higher order term is the desired third order component. Since $a_1$ is the small signal admittance of the diode pair, and is ordinarily positive at the origin of the I-V characteristic, $a_5$ must be positive in order to satisfy the above condition. Moreover, the numerical value of $3a_3^2/a_5$ must be larger than $a_1$, assuming $G_1$ and $G_2$ are positive admittances.

One device which satisfies these conditions simultaneously is the back diode Type BD4 manufactured by the General Electric Company. From a number of devices (i.e., pairs of diodes), the following average coefficients have been determined:

$$a_1 = 0.53 \cdot 10^{-2} \text{ A/V}$$

$$a_3 = 0.56 \cdot 10^0 \text{ A/V}^3$$

$$a_5 = 0.11 \cdot 10^2 \text{ A/V}^5$$

Using these values we find for $G_1 + G_2$, which is incidentally the total admittance shunting the diodes, $$G_1 + G_2 \approx 0.08 \, [A/V]. \quad (13)$$

The corresponding low impedance level is realizable and offers an important advantage for very broadband operation.

Equation (13) only imposes a condition upon the sum of $G_1$ and $G_2$, leaving one more degree of freedom which can be exploited to match the bridge to the source impedance. Since the match is at the fundamental frequency, the diode pair can be replaced by its first order coefficient $a_1$. It then follows that match condition is achieved when $$R_s/2 = R_{11} + 1/(1/R_1 + 1/R_3 + a_1) \quad (14)$$

Furthermore, for the suppression of the fundamental frequency signals, all the bridge resistors should be equal. This means that $$1/R_3 = 1/R_1 + a_1 \quad (15)$$

from which we derive that $$R_{11} = (R_s/2) \sqrt{1 - (a_5/a_3^2 \cdot (4/3 R_s))} \quad (16)$$

Thus, a match to the source and suppresion of the fifth order term is possible if $$R_s > 4a_5/3a_3^2 \quad (17)$$

or, for the particular device chosen, if $R_s > 47$ ohms. For example, if $R_s = 75$ ohms, then $R_{11} = 23$ ohms, $R_1 = 34.3$ ohms and $R_3 = 29$ ohms.

Figure 4:
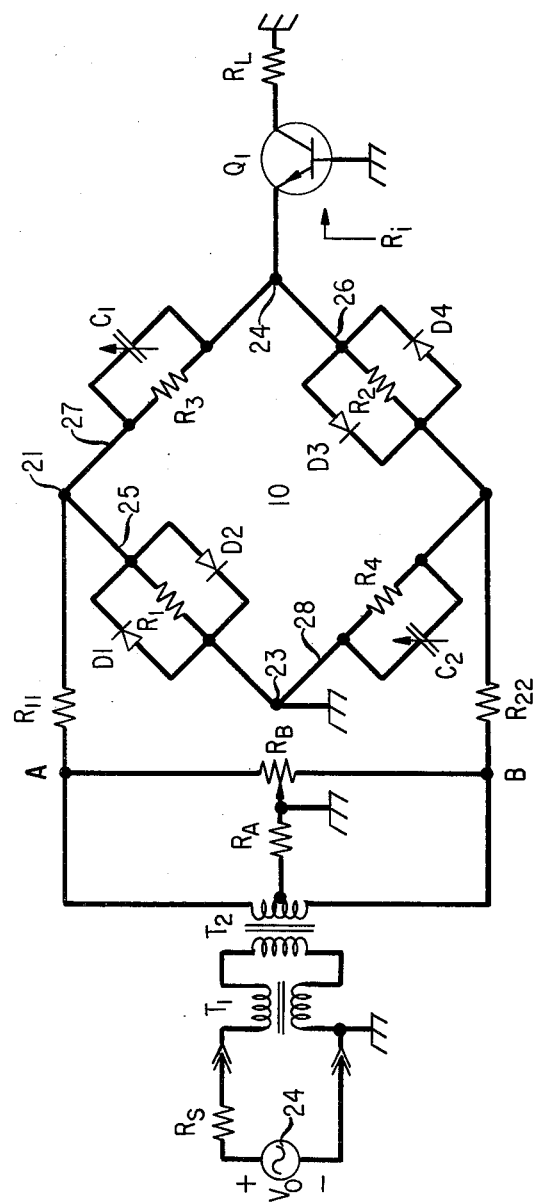
FIG. 4 shows a more complete signal cuber.

FIG. 4 shows, in somewhat greater detail, a cuber circuit in accordance with the present invention. As illustrated, signal source 4 is coupled to the cuber bridge circuit 10 by means of a 75 ohm balun T1 and hybrid transformer T2. The voltages at bridge input terminals A and B are, thus, balanced with respect to ground. Adjusted in the manner described hereinabove, the bridge is balanced with respect to the fundamental frequency signals and, as a result, all fundamental frequency signals cancel at the input to output transistor Q1, which is connected in the common base configuration to output terminal 24 of the cuber.

In order to achieve fundamental frequency signal cancellation over a broad frequency band of interest, slight adjustments may be required to account for differences in the transfer characteristics between the input and output terminals of transformer T2, and for any differences in the reactances of the diode devices. This is accomplished with balancing resistor $R_B$ and trimmer capacitors $C_1$, and $C_2$.

The bridge circuit itself is as described in connection with FIG. 2.

SUMMARY

A distortion generator, in accordance with the present invention, generates predominantly third order intermodulation products over a wide input power range and over a broad frequency band. In one experimental embodiment of the invention, the third order intermodulation products followed the third order relation within 0.1 dB over an output power range between −89 dBm and −47 dBm, and the intermodulation voltages were flat within ±0.03 dB between 59 MHz and 89 MHz. Cancellation of the fundamental frequency signals was better than 65 dB across this band.

While shown as a predistorter, it will be recognized that a cuber circuit can just as readily be used in a post-distortion compensation circuit.

What is claimed is:

1. A cuber circuit comprising:
   a resistive bridge network (10) having four nodes (21, 22, 23, 24);
   a first pair of oppositely-disposed nodes (21, 22) constituting the input terminals of said circuit;
   a second pair of oppositely-disposed nodes (23, 24) constituting the output terminals of said circuit;
   characterized in that:
   a pair of oppositely-poled diodes (D1, D2 and D3, D4) is connected in parallel with the resistor ($R_1$, $R_3$) in each branch (25, 26) of one pair of opposite branches of said bridge.

2. The cuber circuit of claim 1 including a signal source (4) having a source impedance $R_s$;
   characterized in that:
   said signal source is coupled to one node (21) of said first pair of nodes (21, 22) through a first impedance matching resistor $R_{11}$ and to the other node (22) of said first pair of nodes through a second impedance matching resistor $R_{22}$.

3. The cuber circuit of claim 2 wherein the combined current-voltage characteristic of each diode pair is given by $$I = \sum_{\lambda = 0}^{\infty} a_{2\lambda+1} V^{2\lambda+1},$$

and wherein said cuber is
characterized in that:
$$\alpha_1 + G_1 + G_2 = 3\alpha_3^2/\alpha_5$$

so as to suppress fifth order intermodulation components, where:
$\alpha_1$, $\alpha_3$ and $\alpha_5$ are the coefficients of the first, third and fifth order terms of the current-voltage characteristic of said diode pairs;

$G_1 = (R_s/2 + R_{11})^{-1}$; and $G_2 = (R_1 + R_3)/R_1 R_3$.

4. The cuber circuit of claim 3
characterized in that:

$R_{11} = R_s/2 \sqrt{1 - (\alpha_5/\alpha_3^2 \cdot 4/3 R_s)}$
for impedance matching said cuber circuit to said signal source.

* * * * *